(12) United States Patent
Kim

(10) Patent No.: US 8,643,439 B2
(45) Date of Patent: Feb. 4, 2014

(54) OSCILLATION CIRCUIT OF SEMICONDUCTOR APPARATUS

(75) Inventor: Kwan Dong Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 109 days.

(21) Appl. No.: 13/219,652

(22) Filed: Aug. 27, 2011

(65) Prior Publication Data

US 2012/0154057 A1 Jun. 21, 2012

(30) Foreign Application Priority Data

Dec. 20, 2010 (KR) ........................ 10-2010-0130897

(51) Int. Cl.
*H03L 7/00* (2006.01)

(52) U.S. Cl.
USPC .............................. 331/17; 331/185; 331/186

(58) Field of Classification Search
USPC ............ 331/17, 25, 36 C, 45, 135, 143, 144, 331/145, 185, 186; 332/109, 110; 327/198, 327/291, 512

See application file for complete search history.

(56) References Cited

U.S. PATENT DOCUMENTS

| | | | |
|---|---|---|---|
| 6,825,735 B2* | 11/2004 | Chung | 331/135 |
| 7,755,410 B2* | 7/2010 | Oh et al. | 327/291 |
| 8,232,846 B1* | 7/2012 | De Vita et al. | 331/111 |
| 2005/0225386 A1* | 10/2005 | Costa et al. | 330/137 |
| 2006/0139111 A1* | 6/2006 | Pham | 331/36 C |
| 2007/0035283 A1* | 2/2007 | Liao | 323/282 |

FOREIGN PATENT DOCUMENTS

| | | |
|---|---|---|
| JP | 2001102866 A | 4/2001 |
| KR | 2019930006543 Y1 | 9/1993 |

* cited by examiner

*Primary Examiner* — Joseph Chang
*Assistant Examiner* — Jeffrey Shin
(74) *Attorney, Agent, or Firm* — William Park & Associates Patent Ltd.

(57) ABSTRACT

An oscillation circuit of a semiconductor apparatus includes a first level regulation unit configured to regulate an output voltage at an output node according to a difference between a reference voltage and the output voltage, and a second level regulation unit coupled between a power supply voltage terminal and a source voltage terminal.

18 Claims, 6 Drawing Sheets

OSCILLATION CIRCUIT OF SEMICONDUCTOR APPARATUS

CROSS-REFERENCES TO RELATED APPLICATION

The present application claims priority under 35 U.S.C. §119(a) to Korean application number 10-2010-0130897, filed on Dec. 20, 2010 in the Korean Intellectual Property Office, and which is incorporated herein by reference in its entirety.

BACKGROUND

1. Technical Field

The present invention relates to a semiconductor integrated circuit, and more particularly, to an oscillation circuit of a semiconductor apparatus capable of adjusting its duty ratio.

2. Related Art

In general, a semiconductor apparatus requires an oscillation circuit oscillating at a constant operating frequency. In particular, some circuits that require an oscillation circuit oscillating at a constant operating frequency are a power circuit driving a pump for generating a boosted voltage (VPP) or a back bias voltage (VBB) and a PLL circuit determining an oscillation frequency in proportion to an input voltage.

FIG. 1 is a circuit diagram illustrating a conventional oscillation circuit.

As illustrated in FIG. 1, the oscillation circuit 10 is a ring oscillator configured as follows: an output of a first inverter IV1 is coupled to an input of a second inverter IV2; an output of the second inverter IV2 is coupled to an input of a third inverter IV3; an output of the third inverter IV3 is coupled to an input of a fourth inverter IV4; an output of the fourth inverter IV4 is coupled to an input of a fifth inverter IV5; and the fifth inverter IV5 outputs an oscillation signal OSC and the output of the fifth inverter IV5 is coupled to the input of the first inverter IV1. Generally an odd number of inverters are coupled together.

The operation of the conventional oscillation circuit 10 of FIG. 1 will be described below in detail. When the present output of the fifth inverter IV5 is at a high voltage, the high voltage is applied to the input of the first inverter IV1 and is inverted. Thus, the output of the fifth inverter IV5 is at a low voltage. Again, the low voltage is applied to the input of the first inverter IV1 and is inverted. Thus, the output of the fifth inverter IV5 is at a high voltage. In this manner, the conventional oscillation circuit outputs the oscillation signal OSC. By repeating such operations, the oscillation signal OSC having a constant period is outputted. The oscillation period of the oscillation signal OSC is controlled through RC components.

In the conventional oscillation circuit 10, the oscillation period is varied if a power supply voltage (VDD) is varied. Specifically, as the power supply voltage (VDD) decreases, the oscillation period becomes longer. As the power supply voltage (VDD) increases, the oscillation period becomes shorter.

That is, the conventional oscillation circuit 10 has difficulty in obtaining an accurate oscillation period because it is sensitive to variations in process, voltage, and temperature (PVT).

SUMMARY

An oscillation circuit of a semiconductor apparatus, which can generate a stable periodic signal and adjust a duty ratio substantially insensitive to PVT variations, is described.

In one embodiment of the present invention, an oscillation circuit of a semiconductor apparatus includes a first level regulation unit configured to regulate an output voltage at an output node according to a difference between a reference voltage and the output voltage, and a second level regulation unit coupled between a power supply voltage terminal and a source voltage terminal.

In another embodiment of the present invention, an oscillation circuit of a semiconductor apparatus includes an oscillation signal generation unit configured to generate an oscillation signal by regulating an output voltage of an output node according to a difference between a reference voltage and the output voltage. The oscillation circuit may comprise a threshold voltage level generation unit configured to determine a level of a reference threshold voltage according to a plurality of threshold voltage selection signals and the reference voltage generated from the oscillation signal generation unit. The oscillation circuit may also comprise a driving unit configured to determine a duty ratio by comparing the reference threshold voltage determined by the threshold voltage level generation unit with the level of the oscillation signal outputted from the oscillation signal generation unit.

BRIEF DESCRIPTION OF THE DRAWINGS

Features, aspects, and embodiments are described in conjunction with the attached drawings, in which.

DETAILED DESCRIPTION

An oscillation circuit of a semiconductor apparatus according to the present invention will be described below with reference to the accompanying drawings.

Figure 1:
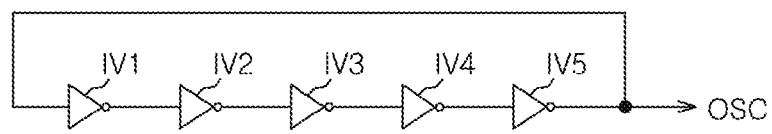
FIG. 1 is a circuit diagram illustrating a conventional oscillation circuit.
Figure 2:
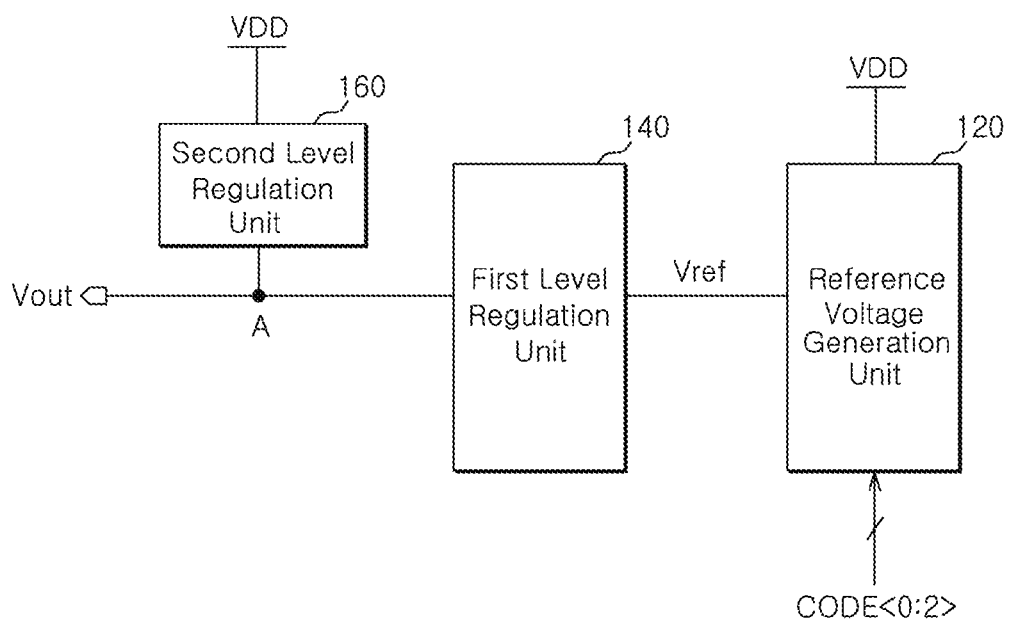
FIG. 2 is a block diagram illustrating an oscillation circuit of a semiconductor apparatus according to one embodiment of the present invention.

FIG. 2 is a block diagram illustrating an oscillation circuit of a semiconductor apparatus according to one embodiment of the present invention.

As illustrated in FIG. 2, the oscillation circuit 100 of the semiconductor apparatus according to one embodiment of the present invention includes a reference voltage generation unit 120, a first level regulation unit 140, and a second level regulation unit 160.

The reference voltage generation unit 120 is configured to generate a reference voltage Vref in response to a plurality of control signals CODE<0:2>. The plurality of control signals CODE<0:2> may be generated from a mode register set (MRS). The reference voltage generation unit 120 may output the generated reference voltage Vref to the first level regulation unit 140. A detailed description of the reference voltage generation unit 120 will be given later with reference to FIG. 3.

The first level regulation unit 140 is coupled between the reference voltage generation unit 120 and the second level regulation unit 160 and may be configured to lower a voltage of an output node A according to a difference between the reference voltage Vref applied from the reference voltage generation unit 120 and the voltage of the output node A. A detailed description of the first level regulation unit 140 will be given later with reference to FIG. 3.

The second level regulation unit 160 may be configured to generate an oscillation signal Vout through a charging/discharging operation of a capacitor CC.

In operation, when the voltage of the output node A is low, the voltage of the output node A is charged by the capacitor CC of the second level regulation unit 160 via a resistor R6. Accordingly, the voltage of the output node A rises with a time constant defined by the product of a resistance of the resistor R6 and a capacitance of the capacitor CC.

When the voltage of the output node A rises by a threshold amount over the reference voltage Vref, the first level regulation unit 140 may turn on to discharge the capacitor CC. That is, when the threshold of the output node A rises by the threshold voltage of the first level regulation unit 140 over the reference voltage Vref applied from the reference voltage generation unit 120, the first level regulation unit 140 turns on to discharge the output node A.

Accordingly, while the voltage of the output node A is lower than the threshold voltage of the first level regulation unit 140 plus the reference voltage Vref, the oscillation circuit 100 of the semiconductor apparatus increases the oscillation signal Vout. When the voltage of the output node A is higher than the threshold voltage of the first level regulation unit 140 over the reference voltage Vref, the oscillation circuit 100 discharges the output node A to a lower voltage.

Since the oscillation circuit 100 of the semiconductor apparatus according to one embodiment of the present invention includes the second level regulation unit 160 using the resistor and the capacitor insensitive to PVT, it can generate the oscillation signal (oscillation frequency) Vout within an allowable frequency error range according to the voltage of the output node A.

Figure 3:
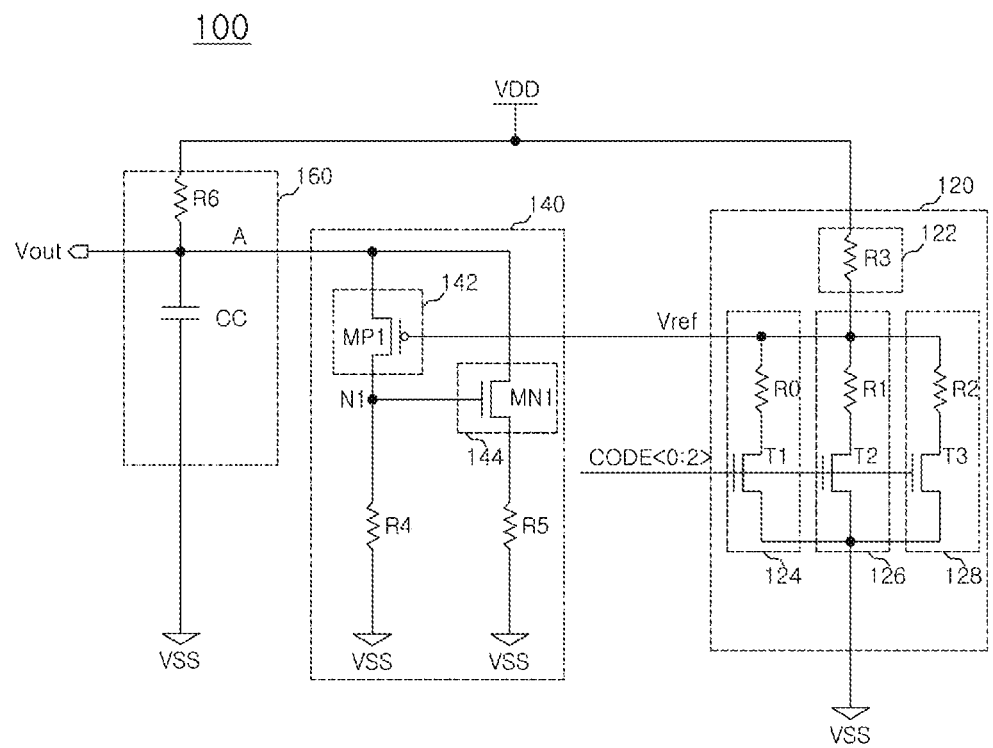
FIG. 3 is a detailed circuit diagram illustrating the oscillation circuit of the semiconductor apparatus according to one embodiment of the present invention.

FIG. 3 is a detailed circuit diagram illustrating the oscillation circuit of the semiconductor apparatus according to one embodiment of the present invention.

As illustrated in FIG. 3, the oscillation circuit 100 of the semiconductor apparatus according to one embodiment of the present invention includes the reference voltage generation unit 120, the first level regulation unit 140, and the second level regulation unit 160.

The reference voltage generation unit 120 may be configured to generate the reference voltage Vref in response to the plurality of control signals CODE<0:2> and output the reference voltage Vref to the first level regulation unit 140.

The reference voltage generation unit 120 includes an input resistor R3, whose first terminal receives a power supply voltage VDD, and signal input sections 124, 126, and 128 connected in parallel to a second terminal of the input resistor R3. The signal input sections 124, 126, and 128 are connected to ground voltage (a source voltage) VSS.

The signal input section 124 includes a resistor R0 coupled to the second terminal of the input resistor R3, and a first NMOS transistor T1 that receives the control signal CODE<0> through its gate. A high voltage level of the first control signal CODE<0> turns on the NMOS transistor T1, enabling current to flow through the resistor R0.

The signal input section 126 includes a resistor R1 coupled to the second terminal of the input resistor R3, and a NMOS transistor T2 that receives the control signal CODE<1> through its gate. A high voltage level of the control signal CODE<1> turns on the NMOS transistor T2, enabling current to flow through the resistor R1.

The third signal input section 128 includes a resistor R2 coupled to the second terminal of the input resistor R3, and a NMOS transistor T3 that receives the control signal CODE<2> through its gate. A high voltage level of the control signal CODE<2> turns on the NMOS transistor T3, enabling current to flow through the resistor R2.

Operation of the reference voltage generation unit 120 will be described. In operation, the reference voltage Vref of the reference voltage generation unit 120 can be controlled by the plurality of control signals CODE<0:2> that determines whether current will flow through the resistors R0, R1, and R2.

When the plurality of external control signals CODE<0:2> are low, the signal input sections 124, 126, and 128 do not operate. Thus, the reference voltage generation unit 120 outputs the power supply voltage VDD as Vref to the first level regulation unit 140.

Selectively setting high the plurality of control signals CODE<0:2> can selectively control turning on the first through third signal input sections 124, 126, and 128. When each signal input section 124, 126, and 128 turns on, current flows through the turned on signal input section through the respective resistor R0, R1, and R2. Accordingly, a voltage divider is formed with the input resistor R3 and the some combination of R0, R1, and R2 in parallel. Thus, the reference voltage generation unit 120 can generate eight different voltage levels for the reference voltage Vref.

The reason for generating the reference voltages having different levels using the reference voltage generation unit 120 is that the oscillation frequency having high frequency can be generated as the reference voltage is lower, and the oscillation frequency having low frequency can be generated as the reference voltage is higher.

That is, in this embodiment, the reference voltage generation unit 120 can control the oscillation frequency by generating the reference voltage Vref at different voltage levels in response to the plurality of control signals CODE<0:2>.

The first level regulation unit 140 is coupled between the reference voltage generation unit 120 and the second level regulation unit 160, and can discharge the output node A according to a difference between the reference voltage Vref applied from the reference voltage generation unit 120 and the voltage of the output node A.

As illustrated in FIG. 3, the first level regulation unit 140 includes a first discharging section 142 and a second discharging section 144. The first discharging section 142 is configured to discharge the output node A according to the difference between the reference voltage Vref applied from the reference voltage generation unit 120 and the voltage of the output node A. The second discharging section 144 is configured to discharge the output node A according to the level of the output terminal of the first discharging section 142.

More specifically, the first discharging section 142 includes a PMOS transistor MP1 receiving the reference voltage Vref through its gate. A source of the PMOS transistor MP1 is coupled to the output node A, and a drain of the PMOS transistor MP1 is coupled to the ground VSS via a resistor R4.

The second discharging section 144 includes an NMOS transistor MN1 whose gate is coupled to the drain of the PMOS transistor MP1. A drain of the NMOS transistor MN1 is coupled to the output node A, and a source of the NMOS transistor MN1 is coupled to the ground VSS via a resistor R5.

Operation of the first level regulation unit 140 will be described. In operation, when the voltage of the output node A is higher than the threshold voltage of the PMOS transistor MP1 with respect to the reference voltage Vref at its gate, the first discharging section 142 of the first level regulation unit 140 can be enabled to discharge the output node.

When the first discharging section 142 is enabled, voltage at the drain of the PMOS transistor MP1, and, hence, at the gate of the NMO transistor MN1, becomes higher. Thus, the second discharging section 144 also is enabled to discharge the output node A. Consequently, the output node A can be discharged in a shorter time, as compared to a case in which only the first discharging section 142 is provided.

Meanwhile, the second level regulation unit 160 includes the resistor R6 and the capacitor CC, which are coupled in series between the power supply voltage VDD and the ground VSS. The output node A may be formed between the resistor R6 and the capacitor CC.

Operation of the second level regulation unit 160 will be described. For example, when the voltage of the output node A is low, the output node A is charged by the capacitor CC. Accordingly, the voltage of the output node A rises with a time constant defined by the product of the resistance of the resistor R6 and the capacitance of the capacitor CC. Thus, the second level regulation unit 160 can generate the rising oscillation signal Vout.

When the voltage of the output node A rises above a threshold voltage of the first level regulation unit 140 over the reference voltage Vref applied from the reference voltage generation unit 120, the first level regulation unit 140 turns on to discharge voltage at the output node A.

While the voltage of the output node A is lower than the threshold voltage of the first level regulation unit 140 plus the reference voltage Vref, the oscillation circuit 100 increases the voltage of the oscillation signal Vout. Accordingly, the oscillation circuit 100 can generate a signal at a periodic rate dependent upon the resistor R6, the capacitor CC, and the reference voltage Vref.

Since the oscillation circuit 100 of the semiconductor apparatus includes the second level regulation unit 160 using the resistor R6 and the capacitor CC, and a variable reference voltage Vref, the period of the oscillation signal may compensate to some degree for PVT variations.

Figure 4:
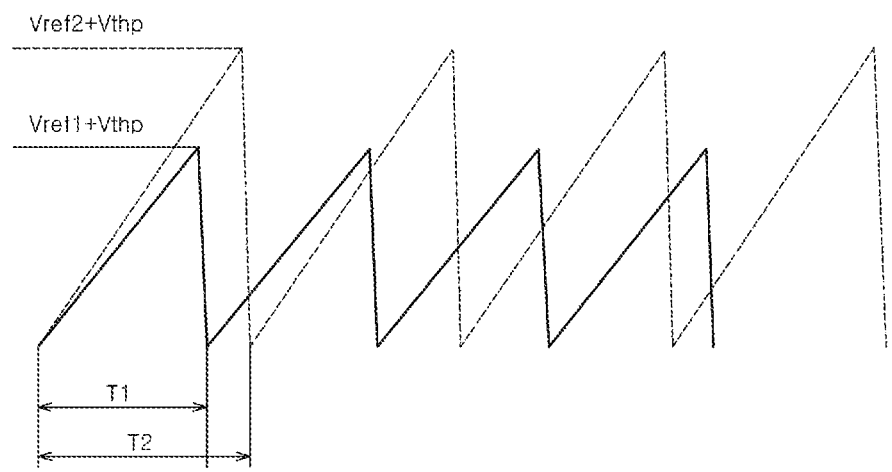
FIG. 4 is a timing diagram of an oscillation signal outputted from the oscillation circuit of the semiconductor apparatus according to one embodiment of the present invention.

FIG. 4 is a timing diagram of the oscillation signal outputted from the oscillation circuit of the semiconductor apparatus according to one embodiment of the present invention.

As illustrated in FIG. 4, the oscillation circuit of the semiconductor apparatus according to one embodiment of the present invention can generate a first oscillation frequency having a first period T1, and a second oscillation frequency having a second period T2. The second oscillation frequency having the second period T2 is a frequency derived from the second reference voltage generated by the first signal input section 124 (FIG. 3) of the reference voltage generation unit 120 (FIGS. 2 and 3), and the first oscillation frequency having the first period T1 is a frequency derived from the third reference voltage generated by the first and second signal input sections 124 and 126 (FIG. 3) of the reference voltage generation unit 120 (FIGS. 2 and 3).

As such, the oscillation circuit of the semiconductor apparatus according to one embodiment of the present invention can determine the level of the oscillation frequency by generating the reference voltages Vref having different levels in response to the plurality of control signals CODE<0:2>.

The maximum values Vref1+Vthp and Vref2+Vthp of the first and second oscillation frequencies according to one embodiment of the present invention can be determined by the threshold voltage of the PMOS transistor MP1 of the first discharging section 142 (FIG. 3) of the first level regulation unit 140 (FIG. 3) with respect to the respective reference voltages.

Figure 5:
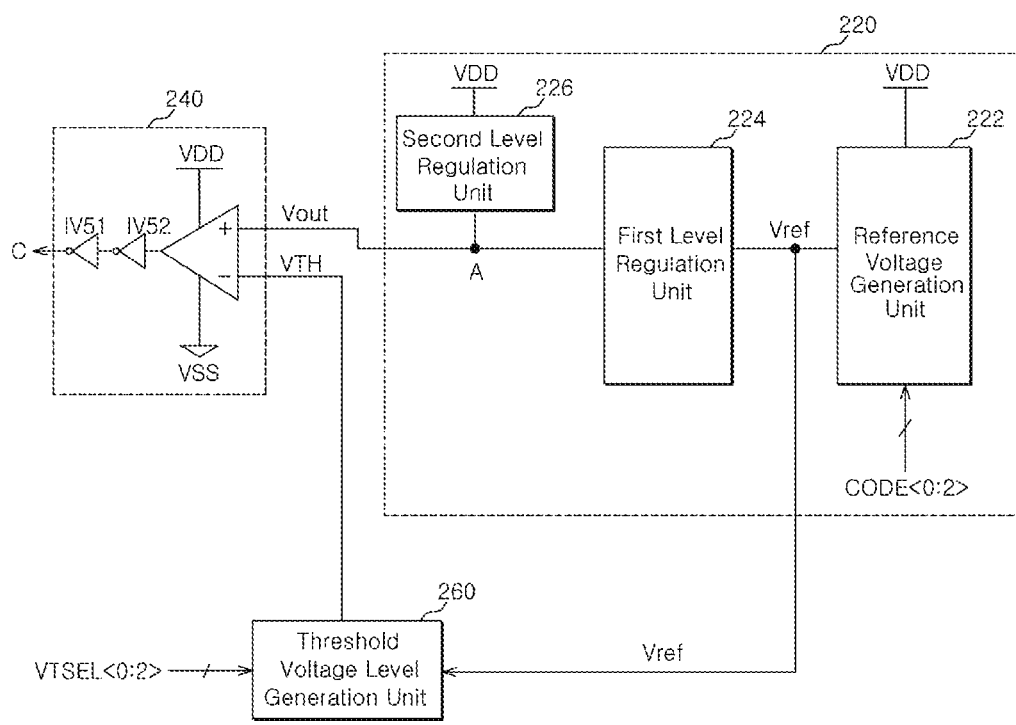
FIG. 5 is a block diagram illustrating an oscillation circuit of a semiconductor apparatus according to another embodiment of the present invention.

FIG. 5 is a block diagram illustrating an oscillation circuit of a semiconductor apparatus according to another embodiment of the present invention.

As illustrated in FIG. 5, the oscillation circuit 200 of the semiconductor apparatus according to another embodiment of the present invention includes an oscillation signal generation block 220, a driving unit 240, and a threshold voltage level generation unit 260.

The oscillation signal generation block 220 is configured to generate a reference voltage Vref in response to a plurality of control signals CODE<0:2> and determine a frequency of an oscillation signal Vout by discharging an output node A according to a difference between the generated reference voltage Vref and the voltage of the output node A. Accordingly, the oscillation signal generation block 220 may be similar to the oscillation circuit 100.

The oscillation signal generation block 220 includes a reference voltage generation unit 222, a first level regulation unit 224, and a second level regulation unit 226. The reference voltage generation unit 222 is configured to generate the reference voltage Vref in response to the plurality of control signals CODE<0:2>, and output the generated reference voltage Vref to the first level regulation unit 224. The first level regulation unit 224 is coupled between the second level regulation unit 226 and the reference voltage generation unit 222 and is configured to discharge the output node A according to a difference between the reference voltage Vref applied from the reference voltage generation unit 222 and the voltage of the output node A. The second level regulation unit 226 is configured to supply a current to the output node A. Since the oscillation signal generation block 220 of FIG. 5 has a configuration substantially identical to the oscillation circuit 100 of FIG. 3, a description of its operation will be omitted.

The threshold voltage level generation unit 260 can determine a level of a reference threshold voltage VTH according to the reference voltage Vref generated from the oscillation signal generation block 220 and a plurality of threshold voltage selection signals VTSEL<0:2>.

Figure 6:
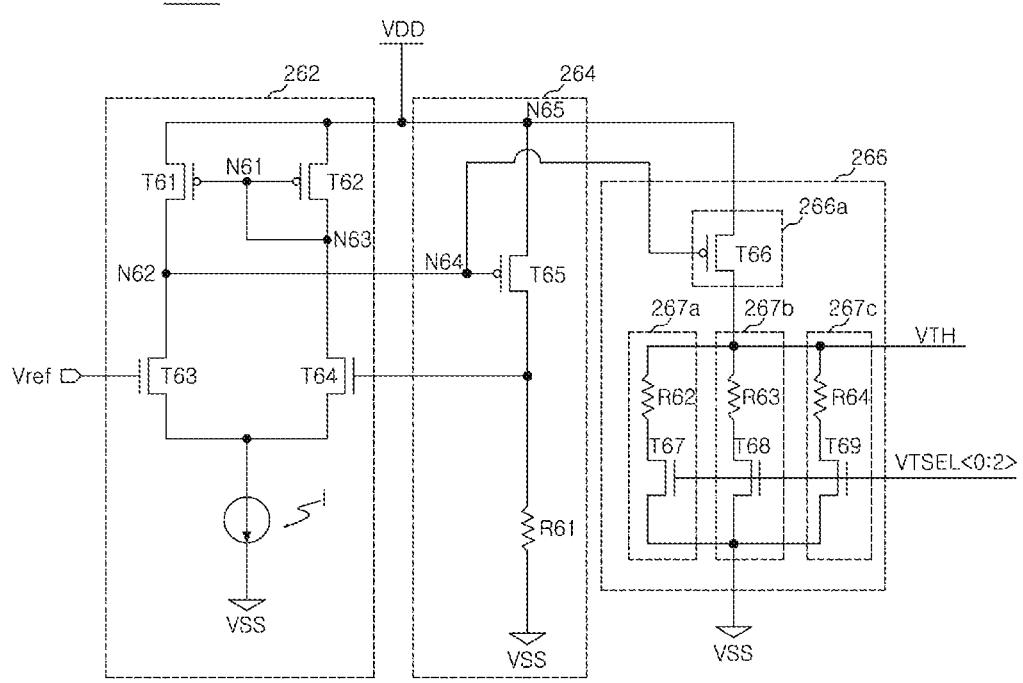
FIG. 6 is a detailed circuit diagram illustrating a threshold voltage level generation unit of FIG. 5.

As illustrated in FIG. 6, the threshold voltage level generation unit 260 includes a level comparison section 262, a feedback loop 264, and a reference threshold voltage generation section 266. The level comparison section 262 is configured to compare the reference voltage Vref applied from the oscillation signal generation block 220 with the voltage applied from the feedback loop 264 and output a comparison signal. The feedback loop 264 is configured to determine the level of the output current in response to the comparison signal of the level comparison section 262. The reference threshold voltage generation section 266 is configured to generate the reference threshold voltage VTH according to a comparison signal outputted from the level comparison section 262 and the plurality of threshold voltage selection signals VTSEL<0:2>.

As illustrated in FIG. 6, the level comparison section 262 may be configured with a differential amplifier. The differential amplifier includes first and second mirror transistors T61 and T62 constituting a current mirror, first and second input transistors T63 and T64 receiving the reference voltage Vref from the oscillation signal generation block 220 and the feedback voltage from the feedback loop 264, and a current sink section I. Since the differential amplifier is a common circuit used in various semiconductor apparatus, including a DRAM device, a detailed description will be omitted.

As illustrated in FIG. 6, the feedback loop 264 serves to equalize the reference voltage Vref, which is applied in connection with the differential amplifier, to the voltage of the resistor R61 connected to a drain of a PMOS transistor T65. The feedback loop 264 uses the output voltage of the differential amplifier of the level comparison section 262, the voltage of the node N62, to control the voltage at the gate of the second input transistor T64 of the differential amplifier. The voltage at the node N62 is also input to the input section 266a.

As illustrated in FIG. 6, the reference threshold voltage generation section 266 includes an input section 266a and switching sections 267a, 267b, and 267c. The voltage at the node N62 of the level comparison section 262 is applied to a gate of the input section 266a. The switching sections 267a, 267b, and 267c are disposed in parallel between a drain of the input section 266a and a ground VSS.

The switching section 267a includes a resistor R62 in series with a NMOS transistor T67 receiving the threshold voltage selection signal VTSEL<0> through its gate.

The switching section 267b includes a resistor R63 in series with a NMOS transistor T68 receiving the threshold voltage selection signal VTSEL<1> through its gate.

The switching section 267c includes a resistor R64 in series with a NMOS transistor T69 receiving the threshold voltage selection signal VTSEL<2> through its gate.

in operation, since the gate of the input section 266a has the same voltage level as that of the node N64, the current through the input section 266a is equal to a current flowing through the PMOS transistor T65. In a case in which the plurality of external threshold voltage selection signals VTSEL<0:2> are not inputted, the first through third switching sections 267a, 267b and 267c do not operate. Thus, the reference threshold voltage generation section 266 generates the reference threshold voltage VTH that is the same as the power supply voltage VDD, and outputs the reference threshold voltage VDD to the driving unit 240.

When the input section 266a is enabled, a combination of the switching section 267a, 267b, and 267c may be turned on via the threshold voltage selection signals VTSEL<0:2>. Thus, the reference threshold voltage generation section 266 can generate reference threshold voltage VTH that is lower than the power supply voltage VDD, and output the generated second reference threshold voltage to the driving unit 240. Accordingly, depending on the threshold voltage selection signals VTSEL<0:2>, there may be eight different levels for the reference threshold voltage VTH.

The driving unit 240 can determine a duty ratio by comparing the reference threshold voltage VTH outputted from the threshold voltage level generation unit 260 with the level of the oscillation signal Vout outputted from the oscillation signal generation block 220.

The driving unit 240 includes a comparator CMP10 and a buffer BUF 10 that may comprise inverters IV51 and IV52. The comparator CMP10 is configured to compare the reference threshold voltage VTH with the oscillation signal Vout, and the buffer BUF10 is configured to buffer the output signal of the comparator CMP10.

Since the oscillation circuit 200 of the semiconductor apparatus according to another embodiment of the present invention includes the oscillation signal generation block 220 that may compensate for PVT variations, it can generate the oscillation signal (oscillation frequency) Vout within an allowable frequency error range according to the voltage of the output node A.

In addition, since the oscillation circuit 200 of the semiconductor apparatus according to another embodiment of the present invention includes the driving unit 240 capable of adjusting the duty ratio, the semiconductor apparatus can be efficiently used. As one example, this is because some circuits require frequencies having arbitrary duty ratios as well as an exact 50:50 duty ratio.

Figure 7:
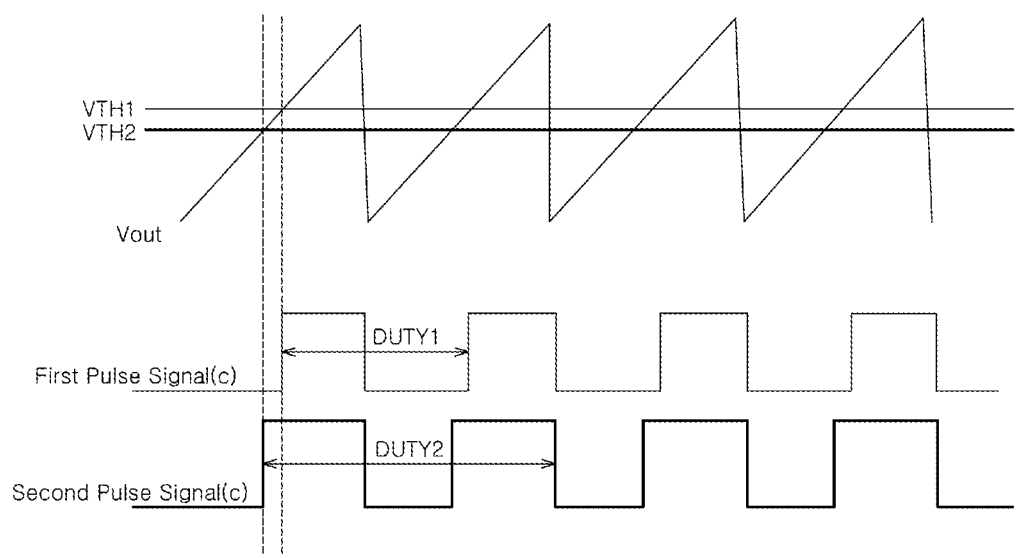
FIG. 7 is a timing diagram of signals outputted from the oscillation circuit of the semiconductor apparatus according to another embodiment of the present invention.

FIG. 7 is a timing diagram of the signals outputted from the oscillation circuit of the semiconductor apparatus according to another embodiment of the present invention.

As illustrated in FIG. 7, the oscillation circuit of the semiconductor apparatus according to another embodiment of the present invention can generate the oscillation frequency Vout having a frequency shown in FIG. 7 from the oscillation signal generation block 220 (FIG. 5).

The driving unit 240 can generate first and second pulse signals having different duty ratios by combining the oscillation frequency Vout generated from the oscillation signal generation block 220 and the first and second reference threshold voltages VH1 and VH2 generated from the threshold voltage level generation unit 260 (FIGS. 5 and 6).

Since the oscillation circuit of the semiconductor apparatus according to another embodiment of the present invention includes the driving unit 240 capable of adjusting the duty ratio, the semiconductor apparatus can be efficiently used.

Figure 8:
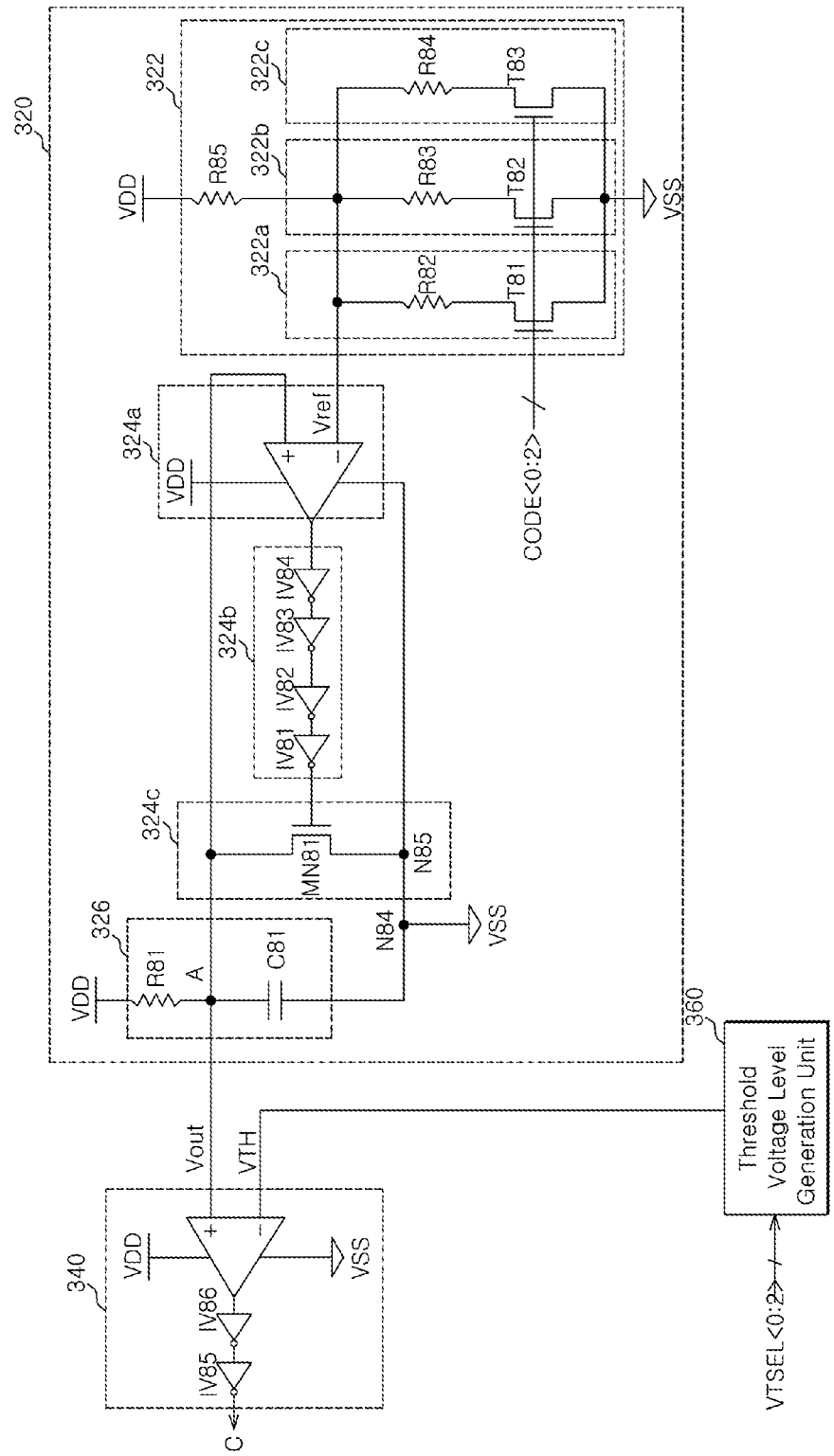
FIG. 8 is a circuit diagram illustrating an oscillation circuit of a semiconductor apparatus according to yet another embodiment of the present invention.

FIG. 8 is a circuit diagram illustrating an oscillation circuit of a semiconductor apparatus according to yet another embodiment of the present invention.

As illustrated in FIG. 8, the oscillation circuit 300 of the semiconductor apparatus according to yet another embodiment of the present invention includes an oscillation signal generation block 320, a driving unit 340, and a threshold voltage level generation unit 360.

The oscillation signal generation block 320 can generate an oscillation signal Vout by regulating a voltage of an output node A according to a difference between a reference voltage Vref and a voltage of the output node A.

The oscillation signal generation block 320 includes a reference voltage generation unit 322, a comparison unit 324a, a buffer unit 324b, a first level regulation unit 324c, and a second level regulation unit 326.

The reference voltage generation unit 322 can generate the reference voltage Vref in response to a plurality of control signals CODE<0:2> and output the generated reference voltage Vref to the comparison unit 324a.

The reference voltage generation unit 322 includes an input resistor R85, a first terminal of which is coupled to a power supply voltage VDD, and input sections 322a, 322b, and 322c are provided in parallel between a second terminal of the input resistor R85 and a ground VSS.

The signal input section 322a includes a resistor R82 coupled in series with a first NMOS transistor T81 receiving the first control signal CODE<0> through its gate.

The signal input section 322b includes a resistor R83 coupled in series with a second NMOS transistor T82 receiving the second control signal CODE<1> through its gate.

The signal input section 322c includes a resistor R84 coupled in series with a third NMOS transistor T83 receiving the third control signal CODE<2> through its gate.

In operation, the reference voltage generation unit 322 can determine the level of the reference voltage Vref by the plurality of control signals CODE<0:2>.

When the plurality of external control signals CODE<0:2> are not inputted, the signal input sections 322a, 322b and 322c do not operate. Thus, the reference voltage generation unit 322 can generate the reference voltage at the power supply voltage VDD and output the reference voltage to the comparison unit 324a.

The control signals CODE<0-2> may be asserted to turn on the signal input sections 322a, 322b and 322c. Thus, the reference voltage generation unit 322 can generate the reference voltage at seven different voltage levels lower than the power supply voltage VDD. Accordingly, the reference voltage generation unit 322 can output any of eight reference voltages to the comparison unit 324a.

The reason for generating the reference voltages having different levels using the reference voltage generation unit 322 is that the oscillation frequency having high frequency can be generated as the reference voltage is lower, and the oscillation frequency having low frequency can be generated as the reference voltage is higher.

That is, in this embodiment, the reference voltage generation unit 322 can determine the oscillation frequency by generating the reference voltages Vref having different levels in response to the plurality of control signals CODE<0:2>.

The comparison unit 324a can compare the reference voltage Vref outputted from the reference voltage generation unit 322 with the voltage of the output node A, and output a comparison result signal to the buffer unit 324b. As one example, the comparison unit 324a may be configured with a comparator.

Accordingly, when the voltage of the output node A is higher than the reference voltage Vref, the comparison unit 324a may output a high level signal to the buffer unit 324b.

When the voltage of the output node A is lower than the reference voltage Vref, the comparison unit 324a may output a low level signal to the buffer unit 324b.

In this embodiment, the buffer unit 324b can buffer the level of the output signal of the comparison unit 324a and provide the buffered level to the first level regulation unit 324c. As one example, the buffer unit 324b may include four inverters IV81, IV82, IV83 and IV84 coupled in series.

The first level regulation unit 324c is coupled between the buffer unit 324b and the second level regulation unit 326, and can discharge the output node A according to a difference between the voltage applied from the buffer unit 324b and the voltage of the output node A.

The first level regulation unit 324c includes an NMOS transistor MN81 receiving the output of the buffer unit 324b at its gate. A drain of the NMOS transistor MN81 may be coupled to the output node A, and a source of the NMOS transistor MN81 may be coupled to a ground VSS.

in operation, when the voltage of the output node A is higher than the threshold voltage of the NMOS transistor MN81 with respect to the output value of the buffer unit 324b, the first level regulation unit 324c is enabled to discharge the output node A.

The second level regulation unit 326 includes a resistor R81 and a capacitor C81, which are coupled in series between the power supply voltage VDD and the ground VSS. The output node A may be a node between the resistor R81 and the capacitor C81.

In operation, when the voltage of the output node A is low, the output node A is charged by the capacitor C81. Accordingly, the voltage of the output node A slowly rises with a time constant defined by the product of the resistance of the resistor R81 and the capacitance of the capacitor C81. Thus, the second level regulation unit 326 may gradually raise the level of the oscillation signal Vout.

When the voltage of the output node A rises above a threshold voltage of the first level regulation unit 324c with respect to the output value of the buffer unit 324b, the first level regulation unit 324c is turned on. Accordingly, when the output node A is discharged due to the operation of the first level regulation unit 324c, the capacitor C81 of the second level regulation unit 326 may be discharged and the oscillation signal Vout has a level of '0', that is, a low level.

As such, when the voltage of the output node A is lower than the threshold voltage of the first level regulation unit 324c with respect to the reference voltage Vref, the oscillation circuit 300 of the semiconductor apparatus according to yet another embodiment of the present invention can raise the level of the oscillation signal Vout. When the voltage of the output node A is higher than the threshold voltage of the first level regulation unit 324c with respect to the reference voltage Vref, the oscillation circuit 300 can discharge the output node A to make the oscillation signal Vout have a level of '0'.

Since the oscillation circuit 300 of the semiconductor apparatus according to yet another embodiment of the present invention includes the first level regulation unit 324c and the second level regulation unit 326 to compensate for PVT variations, it can generate the oscillation signal (oscillation frequency) Vout within an allowable frequency error range according to the voltage of the output node A.

The driving unit 340 includes a comparator CMP20 and a buffer BUF20. The comparator CMP20 is configured to compare the reference threshold voltage VTH with the oscillation signal Vout, and the buffer BUF20 is configured to buffer the output signal of the comparator CMP20. In this case, the buffer BUF20 may include two inverters IV85 and IV86 coupled in series. Since the driving unit 340 according to this embodiment has the same configuration as the driving unit 240 of FIG. 5, a detailed description will be omitted.

The threshold voltage level generation unit 360 can determine the level of the reference threshold voltage VTH according to the reference voltage Vref generated from the oscillation signal generation block 320 and the plurality of threshold voltage selection signals VTSEL<0:2>. Since the threshold voltage level generation unit 360 according to this embodiment has the same configuration as the threshold voltage level generation unit 260 of FIG. 5, a detailed description will be omitted.

The driving unit 340 can determine a duty ratio by comparing the reference threshold voltage outputted from the threshold voltage level generation unit 360 with the level of the oscillation signal outputted from the oscillation signal generation block 320.

Since the oscillation circuit 300 of the semiconductor apparatus according to yet another embodiment of the present invention includes the oscillation signal generation block 320 using the resistor and the capacitor insensitive to PVT, it can generate the oscillation signal (oscillation frequency) Vout within an allowable frequency error range according to the voltage of the output node A.

Moreover, since the oscillation circuit 300 of the semiconductor apparatus according to yet another embodiment of the present invention includes the driving unit 340 capable of adjusting the duty ratio, the semiconductor apparatus can be efficiently used.

While certain embodiments have been described above, it will be understood to those skilled in the art that the embodiments described are by way of example only. For example, the various reference voltage generation units may have been described as comprising three parallel branches, any number of parallel branches may be used. Accordingly, the oscillation circuit of the semiconductor apparatus described herein should not be limited based on the described embodiments. Rather, the oscillation circuit of the semiconductor apparatus described herein should only be limited in light of the claims that follow when taken in conjunction with the above description and accompanying drawings.

What is claimed is:

1. An oscillation circuit comprising:
a first level regulation unit configured to regulate an output voltage at an output node according to a difference between a reference voltage and the output voltage;
a second level regulation unit coupled between a power supply voltage terminal and a source voltage terminals;
a reference voltage generation unit configured to generate the reference voltage regardless of the output voltage and output the generated reference voltage to the first level regulation unit;
a threshold voltage level generation unit configured to determine a level of a reference threshold voltage in response to the reference voltage outputted from the reference voltage generation unit and an external threshold voltage selection signal; and
a driving unit configured to generate a pulse signal by comparing the reference threshold voltage outputted from the threshold voltage level generation unit and a level of an oscillation signal outputted from the second level regulation unit.

2. The oscillation circuit according to claim 1, wherein the reference voltage generation unit varies the reference voltage according to a control signal.

3. The oscillation circuit according to claim 1, wherein the second level regulation unit comprises a resistor and a capacitor coupled in series between the power supply voltage terminal and the source voltage terminal, and the output node is between the resistor and the capacitor.

4. The oscillation circuit according to claim 1, wherein the first level regulation unit comprises a first discharging section configured to be turned on, according to the difference between the reference voltage and the voltage of the output node, to discharge the output node.

5. The oscillation circuit according to claim 4, wherein,
the first discharging section comprises a PMOS transistor receiving the reference voltage via its gate,
a first terminal of the PMOS transistor is coupled to the output node, and
a second terminal of the PMOS transistor is indirectly coupled to the source voltage terminal.

6. The oscillation circuit according to claim 5, wherein the PMOS transistor is indirectly coupled to the source voltage terminal via a resistor.

7. The oscillation circuit according to claim 5, wherein the first level regulation unit further comprises a second discharging section configured to be turned on, according to voltage of the second terminal of the PMOS transistor to discharge the output node.

8. The oscillation circuit according to claim 7, wherein,
the second discharging section comprises an NMOS transistor receiving the voltage at the second terminal of the PMOS transistor,
a first terminal of the NMOS transistor is coupled to the output node, and
a second terminal of the NMOS transistor is indirectly coupled to the source voltage terminal.

9. The oscillation circuit according to claim 8, wherein the NMOS transistor is indirectly coupled to the source voltage terminal via a resistor.

10. An oscillation circuit comprising:
an oscillation signal generation unit configured to generate an oscillation signal by regulating an output voltage of an output node according to a difference between a reference voltage and the output voltage;
a threshold voltage level generation unit configured to determine a level of a reference threshold voltage according to a plurality of threshold voltage selection signals and the reference voltage generated from the oscillation signal generation unit; and
a driving unit configured to determine a duty ratio by comparing the reference threshold voltage with the level of the oscillation signal outputted from the oscillation signal generation unit,
wherein the reference voltage and the reference threshold voltage are generated regardless of a voltage level variation of the output voltage.

11. The oscillation circuit according to claim 10, wherein the threshold voltage level generation unit comprises:
a level comparison section configured to compare the reference voltage applied from the oscillation signal generation unit with a voltage applied from a feedback loop, and output a comparison signal;
the feedback loop configured to determine a level of a output current in response to the comparison signal of the level comparison section; and
a reference threshold voltage generation section configured to generate the reference threshold voltage according to the comparison signal outputted from the level comparison section and the plurality of threshold voltage selection signals.

12. The oscillation circuit according to claim 10, wherein the oscillation signal generation unit comprises:
a first level regulation unit configured to regulate the voltage of the output node according to the difference between the reference voltage and the voltage of the output node; and
a second level regulation unit coupled between a power supply voltage terminal and a source voltage terminal.

13. The oscillation circuit according to claim 12, wherein the oscillation signal generation unit further comprises:
a reference voltage generation unit configured to generate the reference voltage and output the generated reference voltage to the first level regulation unit.

14. The oscillation circuit according to claim 13, wherein the reference voltage generation unit varies the reference voltage according to a control signal.

15. The oscillation circuit according to claim 12, wherein the second level regulation unit comprises a resistor and a capacitor coupled in series between the power supply voltage terminal and the source voltage terminal, and the output node is formed between the resistor and the capacitor.

16. The oscillation circuit according to claim 12, wherein the first level regulation unit comprises a first discharging section configured to be turned on according to the difference between the reference voltage and the voltage of the output node and discharge the output node.

17. The oscillation circuit according to claim 10, wherein the oscillation signal generation unit further comprises:
a comparison unit configured to compare the reference voltage with the voltage of the output node and determine a voltage of an output signal according to the comparison result; and
a buffering unit configured to buffer the output signal of the comparison unit and output the buffered signal to the first level regulation unit.

18. The oscillation circuit according to claim 17, wherein the comparison unit outputs a high level signal when the level of the output node is higher than the level of the reference voltage.

* * * * *